United States Patent
Gambetta et al.

(10) Patent No.: US 10,491,119 B2
(45) Date of Patent: *Nov. 26, 2019

(54) COMBINED HIGH SIDE AND LOW SIDE CURRENT SENSING

(71) Applicant: Dialog Semiconductor (UK) Limited, London (GB)

(72) Inventors: Pietro Gambetta, Leghorn (IT); Luigi Lacapra, Germering (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/726,476

(22) Filed: Oct. 6, 2017

(65) Prior Publication Data
US 2018/0034370 A1 Feb. 1, 2018

Related U.S. Application Data

(63) Continuation of application No. 14/971,159, filed on Dec. 16, 2015, now Pat. No. 9,806,613.

(30) Foreign Application Priority Data

Jul. 23, 2015 (DE) .......................... 10 2015 213 971

(51) Int. Cl.
*G05F 1/573* (2006.01)
*H02M 3/158* (2006.01)
(Continued)

(52) U.S. Cl.
CPC .......... *H02M 3/158* (2013.01); *G01R 31/327* (2013.01); *H02M 2001/0009* (2013.01)

(58) Field of Classification Search
CPC .................. H02M 3/158; H02M 1/08; H02M 2001/0009; H03K 17/18
(Continued)

(56) References Cited

U.S. PATENT DOCUMENTS 6,188,212 B1 * 2/2001 Larson ...................... G05F 1/56
323/274
6,377,034 B1 * 4/2002 Ivanov .................... G05F 3/245
323/224
(Continued)

FOREIGN PATENT DOCUMENTS

EP 2 869 073 5/2015
EP 2869073 A1 * 5/2015 ............. G01R 19/00

OTHER PUBLICATIONS

"MediaTek Announces Pump Express(TM) Fast-Charging for Mobile Devices," by Hsinchu, PRNewswire, Feb. 28, 2014, 2 pgs, found: http://www.prnewswire.com/news-releases/mediatek-announces-pu . . . .
(Continued)

*Primary Examiner* — Rajnikant B Patel
(74) *Attorney, Agent, or Firm* — Saile Ackerman LLC; Stephen B. Ackerman

(57) ABSTRACT

A current sensing circuit is described. The current sensing circuit is for sensing a high side current through a high side switch and/or for sensing a low side current through a low side switch of a half bridge comprising the high side switch and the low side switch, which are arranged in series between a high side potential and a low side potential. The high side switch and the low side switch are in respective on-phases in a mutually exclusive manner. The high side sensing circuit comprises mirroring circuitry to mirror a current from a first node of the high side sensing circuit to an output node of the high side sensing circuit. The current sensing circuit comprises a low side sensing circuit to provide a sensed low side current which is indicative of the low side current during an on-phase of the low side switch.

20 Claims, 7 Drawing Sheets

(51) Int. Cl.
*G01R 31/327* (2006.01)
*H02M 1/00* (2006.01)

(58) Field of Classification Search
USPC ............... 323/207, 224, 237, 259, 266, 277, 323/282–288; 363/16–20, 21.02, 21.03, 363/21.12, 21.17, 40, 44, 71, 127, 132
See application file for complete search history.

(56) References Cited

U.S. PATENT DOCUMENTS

| | | | | |
|---|---|---|---|---|
| 6,559,684 B2 * | 5/2003 | Goodfellow | ..... | G01R 19/16519 327/53 |
| 6,801,030 B2 * | 10/2004 | Tai | ...................... | G01R 19/0092 323/316 |
| 7,141,955 B1 * | 11/2006 | Martinez | ............ | H03K 17/0822 323/272 |
| 7,576,526 B2 * | 8/2009 | Kimura | ............ | G01R 19/16538 323/277 |
| 7,683,593 B2 * | 3/2010 | Tao | .................... | G01R 19/0092 323/277 |
| 7,928,703 B2 * | 4/2011 | Tan | ................... | H02M 7/53803 323/224 |
| 7,960,997 B2 * | 6/2011 | Williams | .......... | H01L 23/49575 324/762.09 |
| 8,368,363 B2 * | 2/2013 | Nishida | .............. | G01R 19/0092 323/225 |
| 9,024,667 B1 * | 5/2015 | Fu | ............................. | H03L 1/00 327/157 |
| 2015/0171737 A1 * | 6/2015 | Pagano | ................... | H02M 1/32 323/284 |

OTHER PUBLICATIONS

German Office Action, File Ref: 10 2015 213 971.9, Applicant: Dialog Semiconductor (UK) Limited, dated Sep. 9, 2018, 8 pages and English language translation, 10 pages.

German Office Action, File Ref: 10 2015 213 971.9, Applicant: Dialog Semiconductor (UK) Limited, dated Sep. 9, 2018, 15 pages and English language translation, 16 pages.

* cited by examiner

700

701
Providing a sensed high side current which is indicative
of the high side current during an on-phase of the high
side switch using a high side sensing circuit.

702
Providing a sensed low side current which is indicative
of the low side current during an on-phase of the low
side switch using a low side sensing circuit.

703
Feeding the sensed low side current to the first node,
such that the current at the output node of the high side
sensing circuit is indicative of the sensed low side
current during the on-phase of the low side switch.

FIG. 7

COMBINED HIGH SIDE AND LOW SIDE CURRENT SENSING

This application is a continuation of U.S. application Ser. No. 14/971,159, filed on Dec. 16, 2015, assigned to a common assignee, and which is herein incorporated by reference in its entirety.

TECHNICAL FIELD

The present document relates to switched mode power converters. In particular, the present document relates to current sensing within a switched mode power converter such as a buck converter.

BACKGROUND

Switched mode power converters make use of information regarding the current through a power switch of the power converter, e.g. for control purposes or for monitoring purposes. Within a current mode, the output voltage of the power converter may be regulated using information regarding the output current of the power converter. Furthermore, information regarding a system which is supplied by the power converter may be obtained by analyzing the output current which is provided by the power converter.

SUMMARY

The present document addresses the technical problem of providing a current sensing circuit for a switched mode power converter having increased accuracy and bandwidth. According to an aspect, a current sensing circuit for sensing a high side current through a high side switch and/or for sensing a low side current through a low side switch is described. The high side switch and the low side switch are arranged in series between a high side potential (e.g. a supply voltage) and a low side potential (e.g. ground) and form a half bridge. The high side switch and the low side switch are typically controlled (by a control unit) such that the switches are in respective on-phases in a mutually exclusive manner. The high side switch may comprise a P-type metaloxide semiconductor (MOS) transistor and/or the low side switch may comprise an N-type metaloxide semiconductor transistor.

The current sensing circuit comprises a high side sensing circuit which is configured to provide a sensed high side current that is indicative of the high side current during an on-phase of the high side switch. The sensed high side current is provided at an output node of the high side sensing circuit. The output node may be coupled to the low side potential via an output resistance and the sensed high side current may correspond to the current through the output resistance.

The high side sensing circuit comprises mirroring circuitry which is configured to mirror a current from a first node of the high side sensing circuit to the output node of the high side sensing circuit. In particular, the mirroring circuitry may be configured to do so, during an on-phase of the low side switch. Furthermore, the mirroring circuitry may be configured to transform a voltage drop across the high side switch into the sensed high side current at the output node of the high side sensing circuit, during an on-phase of the high side switch.

The high side sensing circuit may comprise a first coupling switch which is configured to couple or decouple the first node to or from a midpoint of the half bridge between the high side switch and the low side switch. Furthermore, the high side sensing circuit may comprise a second coupling switch which is configured to couple or decouple the first node to or from the high side potential. Using the first and second coupling switches, the high side sensing circuit may be coupled to the high side switch (for sensing the high side current) or may be decoupled from the high side switch (e.g. for mirroring the sensed low side current which is provided by a low side sensing circuit, as outlined below).

In particular, the high side sensing circuit may comprise a control circuit which is configured to close the first coupling switch and open the second coupling switch during an on-phase of the high side switch. As a result of this, the voltage drop across a differential input of the mirroring circuitry may correspond to the voltage drop across the high side switch (i.e. to the drain-source voltage $V_{DS}$ of the high side switch). Furthermore, the control unit may be configured to open the first coupling switch and close the second coupling switch during an on-phase of the low side switch or during an off-phase of the high side switch, thereby enabling the mirroring circuitry to mirror a sensed low side current (as outlined below). It should be noted that the power converter may be operated in Discontinuous Current Mode (DCM) which foresees also a phase in which both switches are OFF at the same time.

Furthermore, the current sensing circuit comprises a low side sensing circuit which is configured to provide a sensed low side current that is indicative of the low side current during an on-phase of the low side switch. The low side sensing circuit may comprise components which correspond to the components of the high side sensing circuit. In particular, the low side sensing circuit may comprise mirroring circuitry. It should be noted, however, that the components of the low side sensing circuit (which is operated with respect to the low side potential) may be complementary with respect to those of the high side sensing circuit (which is operated with respect to the high side potential). The sensed low side current may be provided at an output node of the low side sensing circuit. The output node of the low side sensing circuit may be coupled to the high side potential via an output resistance, and the sensed low side current may correspond to the current through the output resistance.

The sensed low side current is fed to the first node within the high side sensing circuit. In particular, the output node of the low side sensing circuit may be coupled to the first node of the high side sensing circuit. As a result of this, the current at the output node of the high side sensing circuit is indicative of the sensed low side current during the on-phase of the low side switch. By feeding the sensed low side current to the first node, the high side sensing circuit is pre-biased during the on-phase of the low side switch. This enables the high side sensing circuit to more rapidly converge towards an accurate sensed high side current during the on-phase of the high side switch. Hence, the accuracy and the bandwidth of current sensing are increased.

The mirroring circuitry may comprise an output transistor and an (operational and/or differential) amplifier. A gate of the output transistor may be controlled by an output of the amplifier. A first port (e.g. the source) of the output transistor (which may comprise a P-type MOS transistor) may be coupled to a negative input of the amplifier. The output node of the high side sensing circuit may be coupled to (or may correspond to) a second port (e.g. the drain) of the output transistor. Furthermore, the sensed low side current may be fed to a positive input of the amplifier. In particular, the output node of the low side sensing circuit may be (directly)

coupled to the positive input of the amplifier. By using such mirroring circuitry the sensed high side current may be determined in a precise manner.

The mirroring circuitry may comprise a sensing resistance (e.g. a sensing resistor), wherein the sensing resistance is arranged to couple the negative input of the amplifier to the high side potential. Furthermore, the positive input of the amplifier may be coupled to the midpoint of the half bridge (during the on-phase of the high side switch). The amplifier may be configured to control the output transistor such that the voltage drop at the sensing resistance corresponds to the voltage drop across the high side switch (i.e. to the drain-source voltage of the high side switch). This may be achieved by controlling the current through the sensing resistance using the output transistor, which is arranged in series to the sensing resistance. As a result of this, a precise indication of the high side current may be provided at the output node of the high side sensing circuit.

The mirroring circuitry may comprise biasing means which are configured to provide a bias to the positive input of the amplifier. The biasing means may comprise a current source which is configured to set a bias current. Furthermore, the biasing means may comprise a bias resistance which is coupled to the positive input and which may be arranged such that the bias current flows through the bias resistance. The biasing means may be used for tuning the high side sensing circuit to properties of the high side switch (e.g. to the on-resistance of the high side switch).

The bias resistance (e.g. a bias resistor) may be arranged such that during the on-phase of the high side switch, the bias resistance is coupled to the midpoint of the half bridge, thereby providing a biasing function for the sensing of the high side current. On the other hand, the bias resistance may be arranged such that during the on-phase of the low side switch or during an off-phase of the high side switch, the bias resistance is coupled to the high side potential, thereby providing the mirroring function for the sensed low side current. For this purpose, the sensed low side current may be fed to the first node which is arranged between the positive input of the amplifier and the bias resistor. The change of arrangement of the bias resistance may be achieved using the first and second coupling switches. Again the power converter may be operated in DCM which includes a phase in which both switches are OFF at the same time.

According to a further aspect, another current sensing circuit for sensing a high side current through a high side switch and/or for sensing a low side current through a low side switch is described. This current sensing circuit is complementary to the above mentioned current sensing circuit in that the sensed high side current is fed to a first node of mirroring circuitry of the low side sensing circuit. The features which are described in the present document for a current sensing circuit which feeds the sensed low side signal to the high side sensing circuit are also applicable to a current sensing circuit which feeds the sensed high side signal to the low side sensing circuit.

According to a further aspect, a switched mode power converter (e.g. a buck converter) is described. The power converter comprises a high side switch and a low side switch, which are arranged in series between a high side potential and a low side potential and which form a half bridge. Furthermore, the power converter comprises a current sensing circuit which is configured to provide a sensed high side current and/or a sensed low side current. The current sensing circuit may comprise any combination of features described in the present document. In addition, the power converter comprises a control unit which is configured to put the high side switch and the low side switch in respective on-phases in a mutually exclusive manner, based on the sensed high side current and/or based on the sensed low side current. Furthermore, the control unit may be configured to regulate an output voltage of the power converter to a pre-determined reference voltage using the sensed high side current and/or the sensed low side current.

According to further aspects, corresponding methods for the above mentioned current sensing circuits are described.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein

FIG. 7 shows a flow chart of an example method for providing an indication of the current through the high side switch and/or the low side switch of a power converter.

DESCRIPTION

Figure 1:
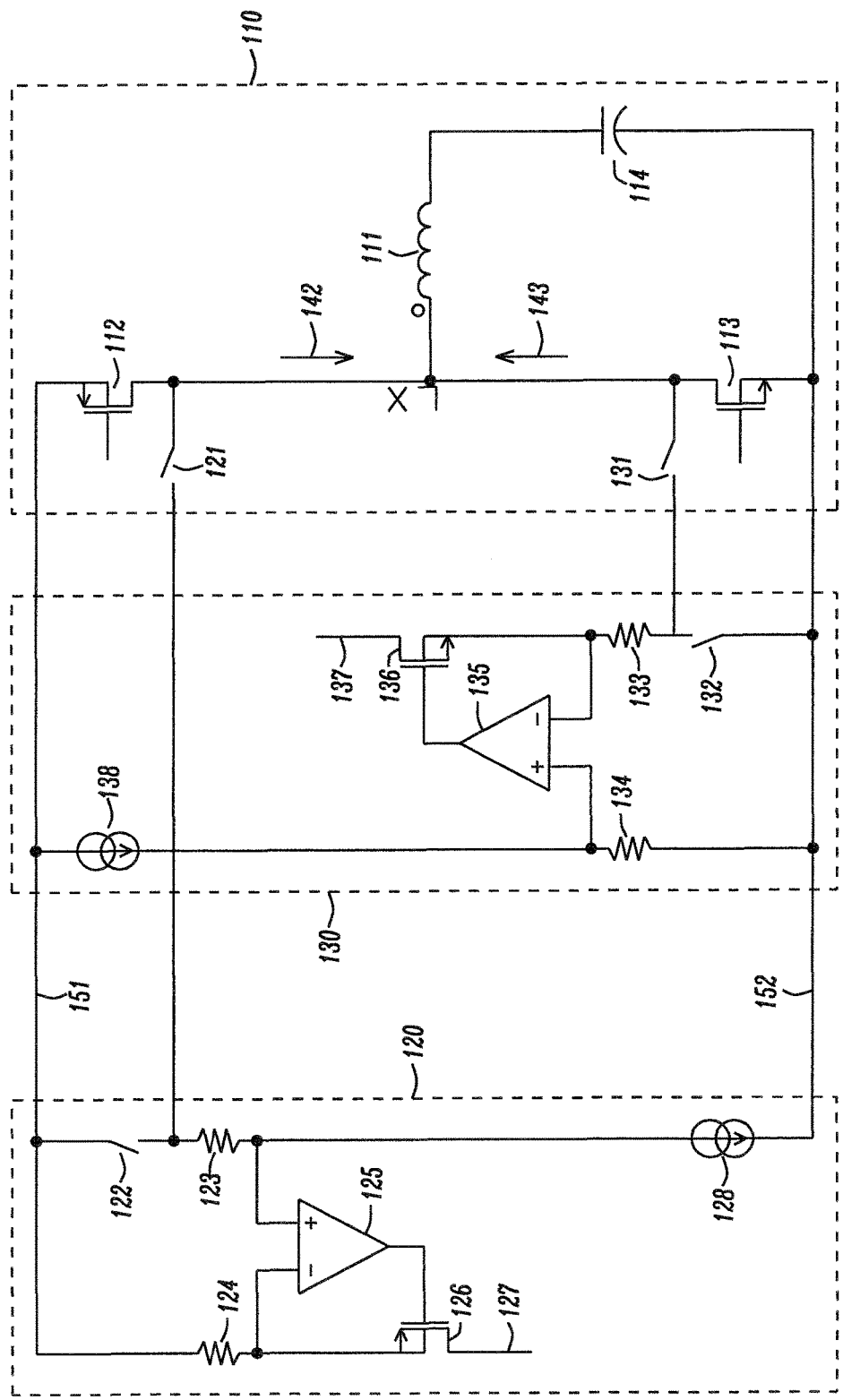
FIG. 1 illustrates example current sensing circuits for the currents through a high side switch and through a low side switch of a power converter.

As outlined above, the present document addresses the technical problem of sensing the current through a power switch of a switched mode power converter. FIG. 1 shows an example power converter 110 (notably a buck converter) which comprises a high side switch 112 (e.g. a PMOS, i.e. P-type metal oxide semiconductor, transistor) and a low side switch 113 (e.g. an NMOS, i.e. N-type MOS, transistor). The high side switch 112 and the low side switch 113 are controlled via their respective gates using a control unit of the power converter 110 (not shown). Typically the switches 112, 113 are closed in a mutually exclusive manner such that the low side switch 113 is open when the high side switch 112 is closed, and vice versa. When the high side switch 112 is closed, a high side current 142 is flowing through the high side switch 112, wherein the high side current 142 is provided to the output via an inductor 111. On the other hand, when the low side switch 113 is closed, a low side current 143 is flowing through the low side switch 113 and through the inductor 111 towards the output of the power converter 110. The power converter 110 may further comprise an output capacitance 114 which is arranged in parallel to the output of the power converter 110.

As such, the power converter 110 comprises a half bridge with switches 112, 113, which is arranged between a high side potential 151 (e.g. a supply voltage) and a low side potential 152 (e.g. ground). The inductor 111 is coupled to a midpoint (indicated by the letters "LX") between the high side switch 112 and the low side switch 113.

FIG. 1 shows a high side sensing circuit 120 which is configured to provide an indication 127 of the high side current 142. The indication 127 may also be referred to as the sensed high side current. For sensing the high side current 142, the first coupling switch 121 is closed and the second coupling switch 122 is opened. The high side sensing circuit 120 comprises an operational amplifier 125 which controls an output transistor 126 to set the indication 127 of the high side current 142. The indication 127 is set such that the voltage at the negative input of the operational amplifier 125 corresponds to the voltage at the positive input of the operation amplifier 125. This is the case if the voltage drop at the sensing resistor 124 is substantially equal to the voltage drop at the high side switch 122 (apart from a bias voltage at the bias resistor 123). The voltage drop at the sensing resistor 124 may be set by adjusting the current through the sensing resistor 124, i.e. by adjusting the indication 127 of the high side current. The bias current source 128 may be used to set an appropriate bias current through the bias resistor 123, for tuning the high side sensing circuit 120.

In an analogous manner, a low side sensing circuit 130 may be provided for providing an indication 137 of the low side current 143 (also referred to as the sensed low side current). When the low side switch 113 is closed, the first coupling switch 131 may be closed and the second coupling switch 132 may be opened. The indication 137 of the low side current 143 may be determined using a sensing resistor 133, an operation amplifier 135, an output transistor 136, a bias resistor 134 and a bias current source 138 (which may form circuitry referred to as mirroring circuitry in the present document).

Figure 2:
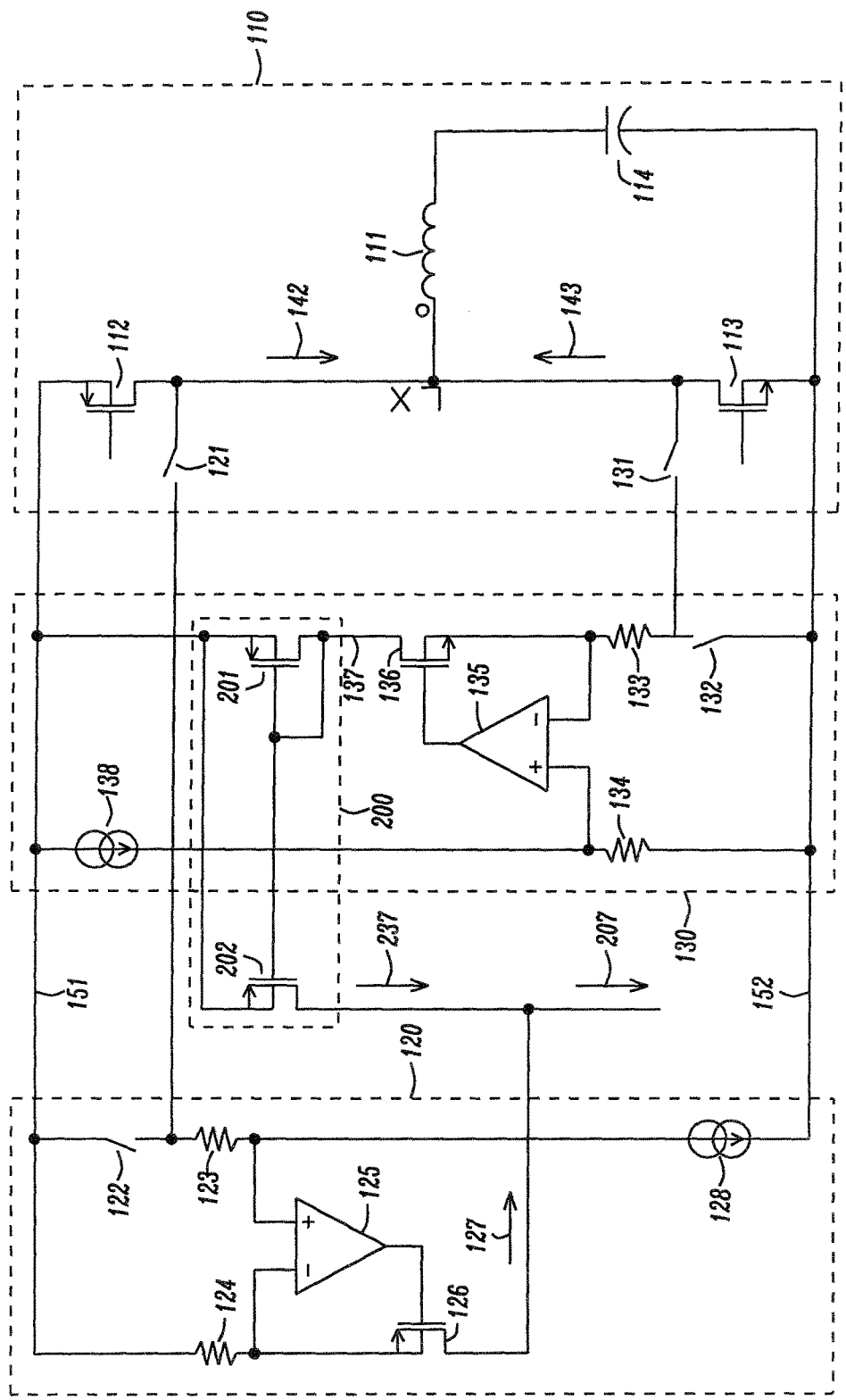
FIG. 2 shows an example combined current sensing circuit for the currents through a high side switch and through a low side switch of a power converter.

FIG. 2 shows additional circuitry for providing a combined indication 207 of the high side current 142 and for the low side current 143. The indication 137 of the low side current 143 may be mirrored using a current mirror 200 with the transistors 201, 202, thereby providing a mirrored indication 237 of the low side current 143. A P-type current mirror 200 may be used to provide a P-type mirrored indication 237. The mirrored indication 237 may then be combined with the (P-type) indication 127 (e.g. by adding the respective currents) to provide the combined indication 207. In an analogous manner, a current mirror (e.g. an NMOS current mirror) may be used to derive a mirrored indication from the indication 127, which is then added to the indication 137 to provide a combined indication.

The circuitry of FIG. 2 is disadvantageous in that the individual current sensing circuits 120, 130 continue to work stand-alone, such that no synergies may be obtained by combining the current sensing. Furthermore, the circuitry of FIG. 2 requires an additional current mirror 200, which typically leads to an extra offset, to an extra bias, to extra space requirements, etc.

Figure 3:
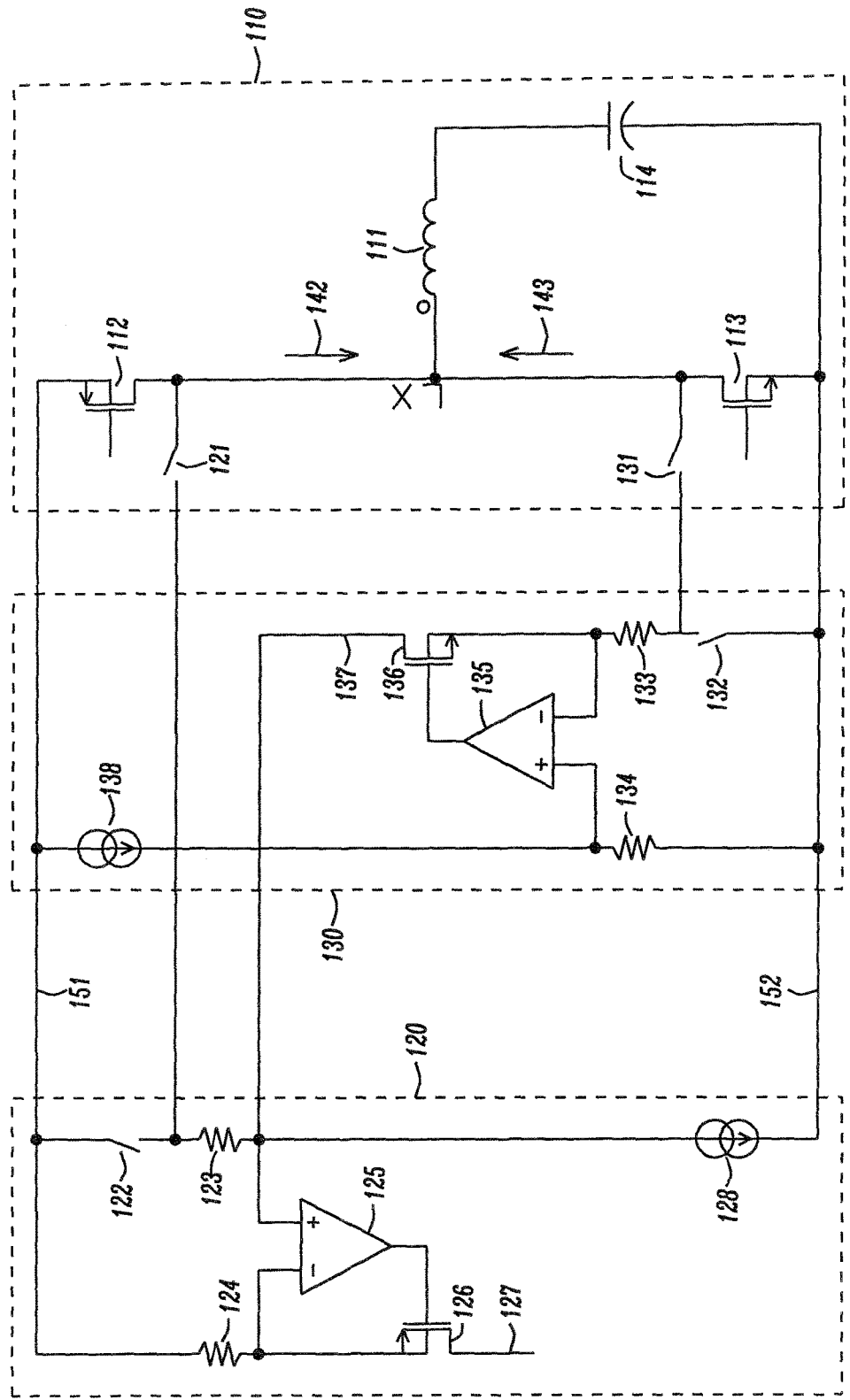
FIG. 3 shows an example current sensing circuit for a high side switch, which is pre-biased using a sensed current for a low side switch.
Figure 4:
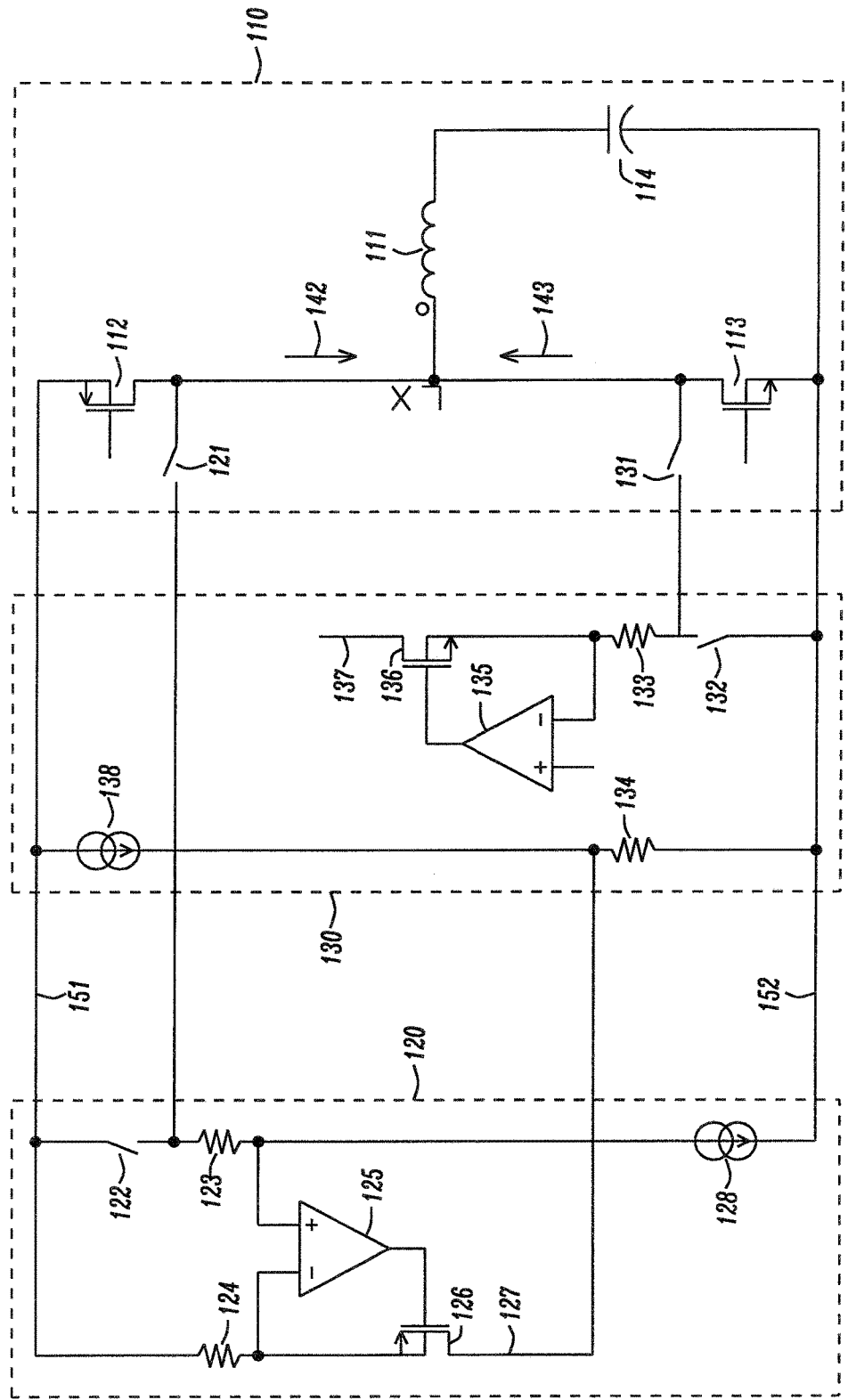
FIG. 4 shows an example current sensing circuit for a low side switch, which is pre-biased using a sensed current for a high side switch.

FIG. 3 shows a high side sensing circuit 120 which makes use of the low side sensing circuit 130 for improving the performance of the high side sensing circuit 120. FIG. 4 shows the analogous/complementary case of a low side sensing circuit 130 which makes use of the high side sensing circuit 120 for improving the performance of the low side sensing circuit 130.

For improving the performance of the high side sensing circuit 120, the indication 137 of the low side current 143 (i.e. the output of the low side sensing circuit 130) is fed to the bias input (i.e. the positive input in FIG. 3) of the operational amplifier 125. In other words, the indication 137 of the low side current 143 is used for pre-biasing the high side sensing circuit 120. FIG. 4 shows the analogous case, where the indication 127 of the high side current 142 is used for pre-biasing the low side sensing circuit 130.

As such, FIG. 3 shows circuitry within which the output of the low side sensing circuit 130 is nested into the high side sensing circuit 120. When the high side switch 112 is closed, the low side switch 113 is open. As a result of this, the indication 137 of the low side switch 143 is zero, and the high side sensing circuit 120 provides a (e.g. P-type) output current as an indication 127 of the high side current 142. Hence, the high side sensing circuit 120 works as if it was stand-alone.

On the other hand, when the high side switch 112 is open and the low side switch 113 is closed, the sensed low side current 137 (e.g. an N-type current) is injected into the high side sensing circuit 120 (the first coupling switch 121 is open and the second coupling switch 122 is closed). The high side sensing circuit 120 acts as a mirror, thereby coping the sensed low side current 137 to the output node of the high side sensing circuit 120 and typically turning an N-type sensed low side current into a P-type current. As such, a mirrored indication of the sensed low side current 137 is provided at the output of the high side sensing circuit 120 during an off-phase of the high side switch 112.

The circuit of FIG. 3 (and FIG. 4) has various advantages. In FIG. 3, the high side sensing circuit 120 is used itself as a mirror for the sensed low side current 137. By doing this, no additional offsets are introduced into the circuit. In particular, the same offset is introduced during the on-phase of the high side switch 112 (when the high side sensing circuit 120 is used for providing an indication 127 for the high side current 142) and during the off-phase of the high side switch 112 (when the high side sensing circuit 120 is used for mirroring the indication 137 of the low side current 143). Furthermore, the circuit of FIG. 3 (and of FIG. 4) does not require additional space. In addition, the high side sensing circuit 120 is maintained active during the off-phase of the high side switch 112. As a result of this, the high side sensing circuit 120 exhibits an increased turn-on speed at the beginning of an on-phase of the high side switch 112. This means that the sensed high side current 127 converges at an increased speed, compared to the circuits of FIGS. 1 and 2. This is particularly beneficial when using the sensed high side current 127 for peak current control of a power converter 110.

As indicated above, FIG. 4 shows the analogous or complementary case to FIG. 3. The output of the high side sensing circuit 120 is nested into the low side sensing circuit 130. During the off-phase of the high side switch 112, the low side switch 113 is closed and the high side switch 112 is open. The high side sensing circuit 120 provides a sensed high side current 127 which is zero and the low side sensing circuit 130 works as if being stand-alone. On the other hand, during the on-phase of the high side switch 112, when the high side switch 112 is closed and the low side switch 113 is open, the sensed high side current 127 is injected into the low side sensing circuit 130 which acts as a mirror coping the sensed high side current 127 to the output node of the low side sensing circuit 130 and typically turning the mirrored current into an N-type current.

The advantages of FIG. 4 as similar to those of FIG. 3. In particular, the increased convergence speed of the sensed low side current 137 may be beneficial for valley current control of a power converter 110.

As such, the high side sensing circuit 120 may be pre-biased by means of the sensed low side current 137 (or vice versa). This may be useful in peak current mode power converters 110, for which the control loop determines the peak value of the current through the inductor 111 by means of a measurement on the high side current 142. When using the sensed low side current 137 to pre-bias the high side sensing circuit 120 prior to the on-phase of the high side switch 112, a faster start-up of the high side sensing circuit 120 may be achieved. This applies in an analogous manner for valley current mode power converters 110, when using the circuit of FIG. 4.

Furthermore, when monitoring the output current of the power converter 110, the fact of nesting the sensed low side current 137 into the high side sensing circuit 120 (or vice versa) has the advantage of using the high side sensing circuit 120 itself as a current mirror to revert the direction of the (NMOS-type) sensed low side current 137 (or vice versa). As such, no additional current mirror is needed, thereby avoiding additional current consumption and offsets.

Figure 5:
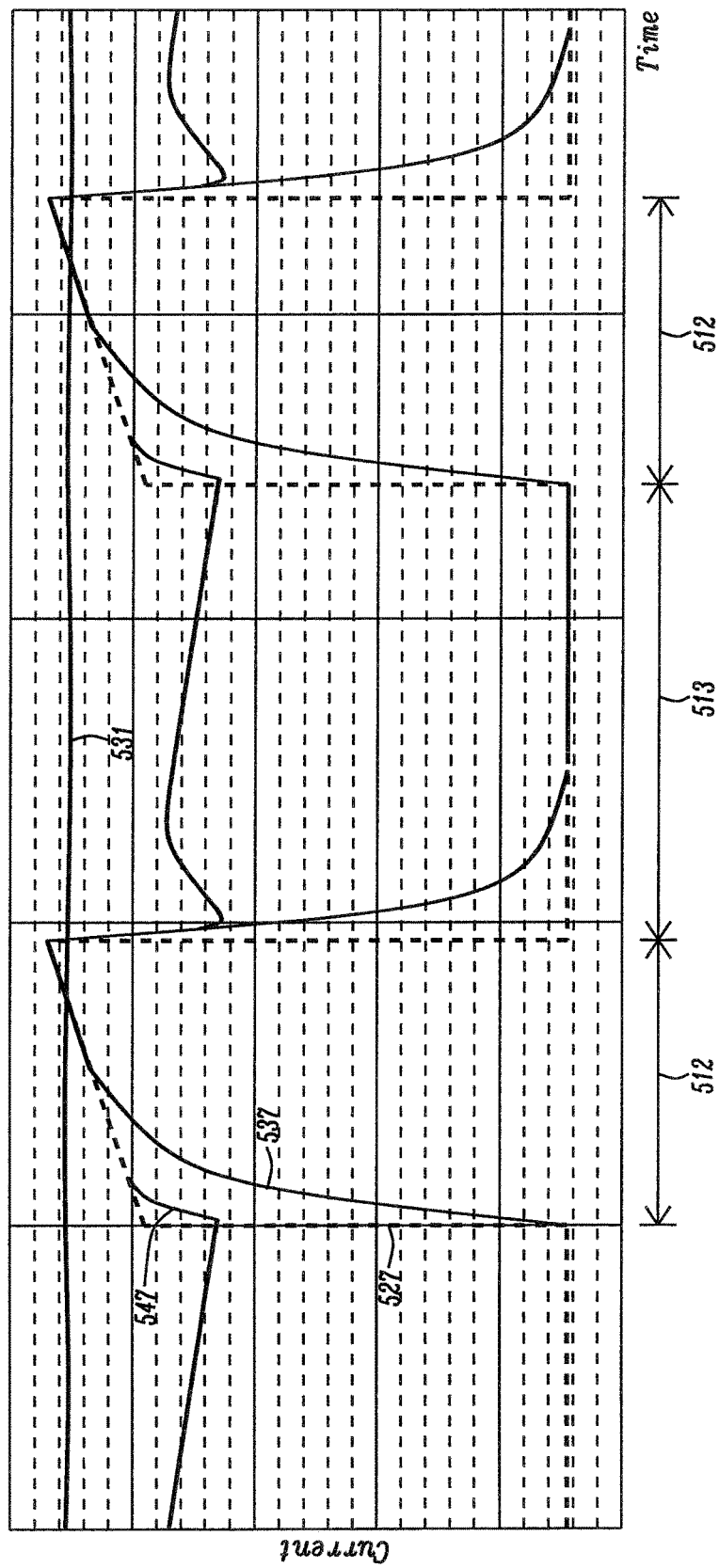
FIGS. 5 and 6 show example sensed currents which are provided by different current sensing circuits.
Figure 6:
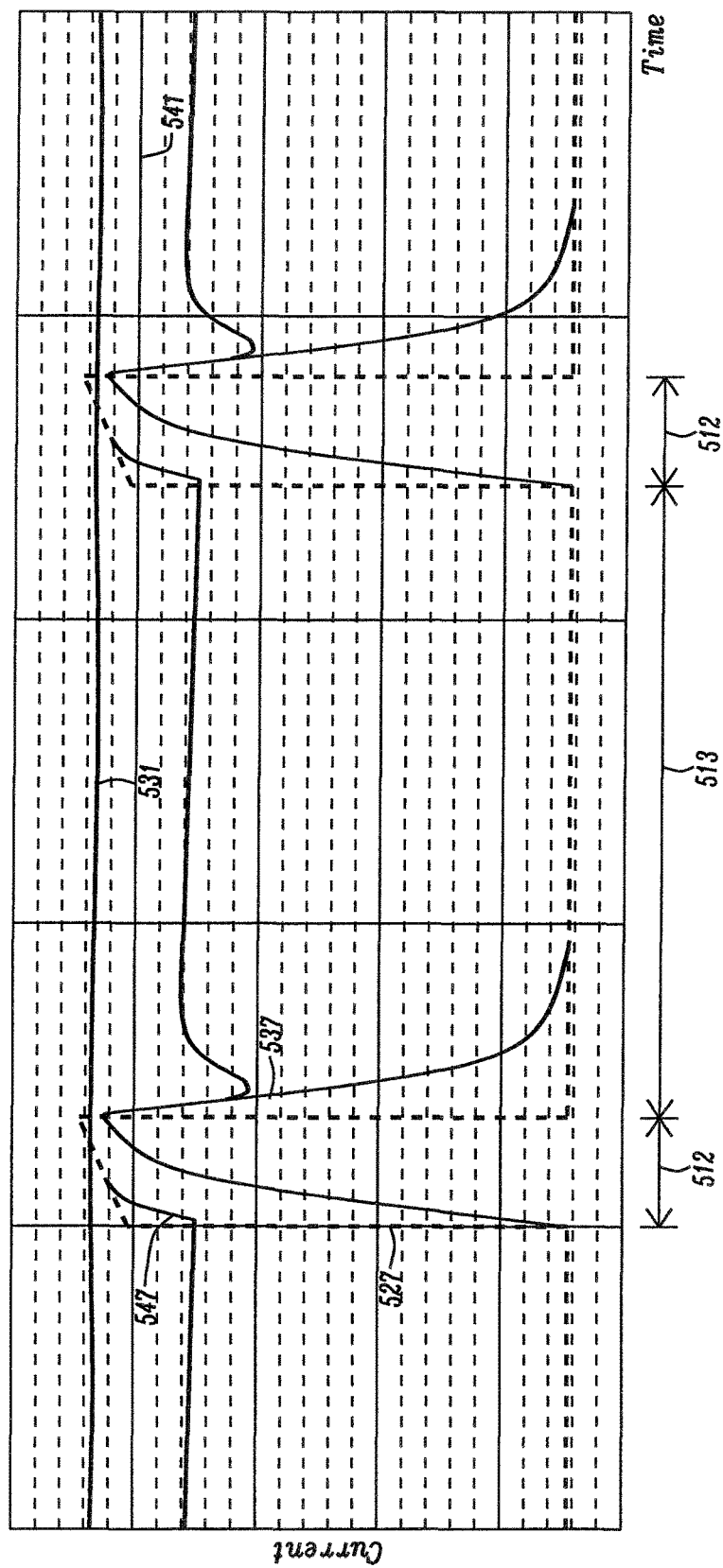

FIGS. 5 and 6 show experimental results. In particular, FIG. 5 shows the signals of a peak current mode modulator, which may be used for determining a time instant for terminating the on-phase 512 of the high side switch 112 and for starting the off-phase 513 of the high side switch 112 (which typically corresponds to the on-phase of the low side switch 113). The sensed high side current 127 (which may be used as a modulator ramp) is compared with a control signal 531 (e.g. an error voltage) to define the duty cycle (i.e. the length of the on-phase 512) of the switched mode power converter 110.

During the on-phase 512, when the high side switch 112 is turned on, the sensed high side current 127 represents the current flowing in the high side switch 112. The ideal shape of this current is shown as a reference curve 527. When using the high side sensing circuit 120 stand-alone (as shown e.g. in FIG. 1), the sensed high side current 127 according to the curve 537 is obtained. It can be seen that the sensed high side current 127 according to curve 537 requires a relatively long time interval for converging towards the reference curve 527. On the other hand, when pre-biasing the high side sensing circuit 120 using the sensed low side current 137, the sensed high side current 127 corresponds to curve 547. It can be seen that the transient at the beginning of the on-phase 512 is substantially smaller than for curve 537, and that the time interval for converging towards the reference curve 527 is substantially reduced.

FIG. 6 shows the modulator signals of FIG. 5, however, with a reduced duty cycle. Due to the reduced duty cycle, the sensed high side current 127 of the stand-alone high side sensing circuit 120 (curve 537) does not have the time to converge towards the reverence curve 527 within the duration of the on-phase 512 of the high side switch 112. As a result of this, the control signal 531 (e.g. an error voltage) is reduced by the regulation loop to a modified control signal 541, in order to try to maintain the output voltage of the power converter 110 at a desired level. This shift of the control signal 541 may lead to an offset of the output voltage of the power converter 110 for regulation loops which exhibit finite gain error amplification. Furthermore, the increased slope of the curve 537 may have an impact on the AC (alternating current) performance of the power converter 110.

It can be seen from FIG. 6 that when pre-biasing the high side sensing circuit 120 (as shown in FIG. 3), the convergence or settling speed of the sensed high side current 127 increases (curve 547), thereby avoiding the above mentioned effects on the regulation of the power converter 110.

FIG. 7 shows a flow chart of an example method 700 for sensing a high side current 142 through a high side switch 112 and/or for sensing a low side current 143 through a low side switch 113 of a half bridge comprising the high side switch 112 and the low side switch 113, which are arranged in series between a high side potential 151 and a low side potential 152. The high side switch 112 and the low side switch 113 are controlled to be in respective on-phases 512, 513 in a mutually exclusive manner.

The method 700 comprises providing 701 a sensed high side current 127 which is indicative of the high side current 142 during an on-phase 512 of the high side switch 112 using a high side sensing circuit 120. The high side sensing circuit 120 comprises mirroring circuitry 123, 124, 125, 126, 128 which is configured to mirror a current from a first node of the high side sensing circuit 120 to an output node of the high side sensing circuit 120 (at least during an on-phase 153 of the low side switch 113). The sensed high side current 127 is provided at the output node of the high side sensing circuit 120.

The method 700 further comprises providing 702 a sensed low side current 137 which is indicative of the low side current 143 during an on-phase 513 of the low side switch 113 using a low side sensing circuit 130. Furthermore, the method 700 comprises feeding 703 the sensed low side current 137 to the first node, such that the current at the output node of the high side sensing circuit 120 is indicative of the sensed low side current 137 during the on-phase 513 of the low side switch 113.

By feeding back the sensed low side current 137 to the first node of the high side sensing circuit 120, the high side sensing circuit 120 is pre-biased, thereby providing the advantages outlined above.

It should be noted that in a corresponding version of method 700 (corresponding to the circuitry of FIG. 4), the low side sensing circuit 130 comprises mirroring circuitry 133, 134, 135, 136, 138 and the sensed high side current 127 is fed to the first node of the mirroring circuitry 133, 134, 135, 136, 138 of the low side sensing circuit 130.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A current sensing circuit for a high side current through a high side switch and/or for a low side current through a low side switch of a half bridge comprising the high side switch and the low side switch, which are arranged in series between a high side potential and a low side potential; wherein the high side switch and the low side switch are in respective on-phases in a mutually exclusive manner; wherein the current sensing circuit comprises,
- a high side sensing circuit configured to provide a sensed high side current which is indicative of the high side current during an on-phase of the high side switch; wherein the high side sensing circuit comprises mirroring circuitry which is configured to mirror a current from a first node of the high side sensing circuit to an output node of the high side sensing circuit; wherein the sensed high side current is provided at the output node;
- a low side sensing circuit configured to provide a sensed low side current which is indicative of the low side current during an on-phase of the low side switch; wherein the sensed low side current is fed to the mirroring circuitry, such that the current at the output node is indicative of the sensed low side current during the on-phase of the low side switch;
- a first coupling switch which is configured to couple or decouple the first node to or from a midpoint of the half bridge between the high side switch and the low side switch;
- a second coupling switch which is configured to couple or decouple the first node to or from the high side potential; and
- a control circuit which is configured to
  - close the first coupling switch and open the second coupling switch during the on-phase of the high side switch; and
  - open the first coupling switch and close the second coupling switch during the on-phase of the low side switch.

2. The current sensing circuit of claim 1, wherein
the mirroring circuitry comprises an output transistor and an amplifier; a gate of the output transistor is controlled by an output of the amplifier;
a first port of the output transistor is coupled to a negative input of the amplifier;
the output node is coupled to a second port of the output transistor; and
the sensed low side current is fed to a positive input of the amplifier.

3. The current sensing circuit of claim 2, wherein
the mirroring circuitry comprises a sensing resistance;
the sensing resistance is arranged to couple the negative input of the amplifier to the high side potential.

4. The current sensing circuit of claim 2, wherein the mirroring circuitry comprises biasing means which are configured to provide a bias to the positive input of the amplifier.

5. The current sensing circuit of claim 4, wherein the biasing means comprise
a current source which is configured to set a bias current; and
a bias resistance which is coupled to the positive input and which is arranged such that the bias current flows through the bias resistance.

6. The current sensing circuit of claim 5, wherein the bias resistance is arranged such that
during the on-phase of the high side switch the bias resistance is coupled to the midpoint of the half bridge; and
during the on-phase of the low side switch the bias resistance is coupled to the high side potential.

7. The current sensing circuit of claim 6, wherein the sensed low side current is fed to first node which is arranged between the positive input of the amplifier and the bias resistor.

8. The current sensing circuit of claim 1, wherein
the output node is coupled to the low side potential via an output resistance; and
the sensed high side current corresponds to a current through the output resistance.

9. The current sensing circuit of claim 1, wherein
the high side switch comprises a P-type metaloxide semiconductor transistor; and
the low side switch comprises a N-type metaloxide semiconductor transistor.

10. A current sensing circuit for a high side current through a high side switch and/or for a low side current through a low side switch of a half bridge comprising the high side switch and the low side switch, which are arranged in series between a high side potential and a low side potential; wherein the high side switch and the low side switch are controlled to be in respective on-phases in a mutually exclusive manner; wherein the current sensing circuit comprises,
- a high side sensing circuit configured to provide a sensed high side current which is indicative of the high side current during an on-phase of the high side switch;
- a low side sensing circuit configured to provide a sensed low side current which is indicative of the low side current during an on-phase of the low side switch; wherein the low side sensing circuit comprises mirroring circuitry which is configured to mirror a current from a first node of the low side sensing circuit to an output node of the low side sensing circuit; wherein the sensed low side current is provided at the output node; wherein the sensed high side current is fed to the mirroring circuitry, such that the current at the output node is indicative of the sensed high side current during the on-phase of the high side switch;
- a first coupling switch which is configured to couple or decouple the first node to or from a midpoint of the half bridge between the high side switch and the low side switch; and
- a second coupling switch which is configured to couple or decouple the first node to or from the low side potential;
- a control circuit which is configured to
  - close the first coupling switch and open the second coupling switch during the on-phase of the low side switch; and
  - open the first coupling switch and close the second coupling switch during the on-phase of the high side switch.

11. A switched mode power converter, wherein the power converter comprises,
- a high side switch and a low side switch, which are arranged in series between a high side potential and a low side potential and which form a half bridge;
- a current sensing circuit for sensing a high side current through a high side switch and/or for sensing a low side current through a low side switch of the half bridge; and
- a control unit which is configured to put the high side switch and the low side switch in respective on-phases in a mutually exclusive manner, based on the sensed high side current and/or the sensed low side current,
wherein the current sensing circuit comprises,
  - a high side sensing circuit configured to provide a sensed high side current which is indicative of the high side current during an on-phase of the high side switch; wherein the high side sensing circuit comprises mirroring circuitry which is configured to mirror a current from a first node of the high side sensing circuit to an output node of the high side sensing circuit; wherein the sensed high side current is provided at the output node;
a low side sensing circuit configured to provide a sensed low side current which is indicative of the low side current during an on-phase of the low side switch; wherein the sensed low side current is fed to the mirroring circuitry, such that the current at the output node is indicative of the sensed low side current during the on-phase of the low side switch; and
a control circuit which is configured to
close the first coupling switch and open the second coupling switch during the on-phase of the high side switch; and
open the first coupling switch and close the second coupling switch during the on-phase of the low side switch.

12. A switched mode power converter, wherein the power converter comprises,
a high side switch and a low side switch, which are arranged in series between a high side potential and a low side potential and which form a half bridge;
a current sensing circuit for sensing a high side current through a high side switch and/or for sensing a low side current through a low side switch of the half bridge; and
a control unit which is configured to put the high side switch and the low side switch in respective on-phases in a mutually exclusive manner, based on the sensed high side current and/or the sensed low side current,
wherein the current sensing circuit comprises,
a high side sensing circuit configured to provide a sensed high side current which is indicative of the high side current during an on-phase of the high side switch;
a low side sensing circuit configured to provide a sensed low side current which is indicative of the low side current during an on-phase of the low side switch; wherein the low side sensing circuit comprises mirroring circuitry which is configured to mirror a current from a first node of the low side sensing circuit to an output node of the low side sensing circuit; wherein the sensed low side current is provided at the output node; wherein the sensed high side current is fed to the mirroring circuitry, such that the current at the output node is indicative of the sensed high side current during the on-phase of the high side switch;
a first coupling switch which is configured to couple or decouple the first node to or from a midpoint of the half bridge between the high side switch and the low side switch; and
a second coupling switch which is configured to couple or decouple the first node to or from the low side potential;
a control circuit which is configured to
close the first coupling switch and open the second coupling switch during the on-phase of the low side switch; and
open the first coupling switch and close the second coupling switch during the on-phase of the high side switch.

13. A method for sensing a high side current through a high side switch and/or for sensing a low side current through a low side switch of a half bridge comprising the high side switch and the low side switch, which are arranged in series between a high side potential and a low side potential; wherein the high side switch and the low side switch are controlled to be in respective on-phases in a mutually exclusive manner; wherein the method comprises,
providing a sensed high side current which is indicative of the high side current during an on-phase of the high side switch using a high side sensing circuit; wherein the high side sensing circuit comprises mirroring circuitry to mirror a current from a first node of the high side sensing circuit to an output node of the high side sensing circuit; wherein the sensed high side current is provided at the output node;
providing a sensed low side current which is indicative of the low side current during an on-phase of the low side switch using a low side sensing circuit;
feeding the sensed low side current to the mirroring circuitry, such that the current at the output node is indicative of the sensed low side current during the on-phase of the low side switch;
providing a first coupling switch which is configured to couple or decouple the first node to or from a midpoint of the half bridge between the high side switch and the low side switch;
providing a second coupling switch which is configured to couple or decouple the first node to or from the high side potential;
closing the first coupling switch and open the second coupling switch during the on-phase of the high side switch; and
opening the first coupling switch and close the second coupling switch during the on-phase of the low side switch.

14. A method for sensing a high side current through a high side switch and/or for sensing a low side current through a low side switch of a half bridge comprising the high side switch and the low side switch, which are arranged in series between a high side potential and a low side potential; wherein the high side switch and the low side switch are controlled to be in respective on-phases in a mutually exclusive manner; wherein the method comprises,
providing a sensed high side current which is indicative of the high side current during an on-phase of the high side switch using a high side sensing circuit;
providing a sensed low side current which is indicative of the low side current during an on-phase of the low side switch using a low side sensing circuit; wherein the low side sensing circuit comprises mirroring circuitry to mirror a current from a first node of the low side sensing circuit to an output node of the low side sensing circuit; wherein the sensed low side current is provided at the output node;
feeding the sensed high side current to the mirroring circuitry, such that the current at the output node is indicative of the sensed high side current during the on-phase of the low side switch;
providing a first coupling switch which is configured to couple or decouple the first node to or from a midpoint of the half bridge between the high side switch and the low side switch;
providing a second coupling switch which is configured to couple or decouple the first node to or from the low side potential;
closing the first coupling switch and open the second coupling switch during the on-phase of the low side switch; and
opening the first coupling switch and close the second coupling switch during the on-phase of the high side switch.

15. The method of claim 13, wherein the mirroring circuitry comprises an output transistor and an amplifier;

a gate of the output transistor is controlled by an output of the amplifier;

a first port of the output transistor is coupled to a negative input of the amplifier;

the output node is coupled to a second port of the output transistor; and the sensed low side current is fed to a positive input of the amplifier.

16. The method of claim 15, wherein the mirroring circuitry comprises a sensing resistance;

the sensing resistance is arranged to couple the negative input of the amplifier to the high side potential.

17. The method of claim 15, wherein the mirroring circuitry comprises biasing means to provide a bias to the positive input of the amplifier.

18. The method of claim 13, wherein the output node is coupled to the low side potential via an output resistance; and the sensed high side current corresponds to a current through the output resistance.

19. The method of claim 14, wherein the mirroring circuitry comprises an output transistor and an amplifier;

a gate of the output transistor is controlled by an output of the amplifier;

a first port of the output transistor is coupled to a negative input of the amplifier;

the output node is coupled to a second port of the output transistor; and the sensed low side current is fed to a positive input of the amplifier.

20. The method of claim 19, wherein the mirroring circuitry comprises a sensing resistance;

the sensing resistance is arranged to couple the negative input of the amplifier to the high side potential.

* * * * *